(12) United States Patent
Park et al.

(10) Patent No.: US 11,262,407 B2
(45) Date of Patent: Mar. 1, 2022

(54) METHOD AND APPARATUS WITH BATTERY STATE ESTIMATION

(71) Applicant: Samsung Electronics Co., Ltd., Suwon-si (KR)

(72) Inventors: Jeonghyun Park, Seoul (KR); Kaeweon You, Hwaseong-si (KR); Jinho Kim, Yongin-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 57 days.

(21) Appl. No.: 16/857,377

(22) Filed: Apr. 24, 2020

(65) Prior Publication Data
US 2021/0165047 A1    Jun. 3, 2021

(30) Foreign Application Priority Data
Dec. 2, 2019   (KR) .................. 10-2019-0158244

(51) Int. Cl.
| | |
|---|---|
| *G01R 31/367* | (2019.01) |
| *G01R 31/392* | (2019.01) |
| *G01R 31/36* | (2020.01) |
| *G06F 17/11* | (2006.01) |
| *G01R 31/3835* | (2019.01) |
| *G01R 31/374* | (2019.01) |

(52) U.S. Cl.
CPC ......... *G01R 31/367* (2019.01); *G01R 31/374* (2019.01); *G01R 31/3835* (2019.01); *G01R 31/392* (2019.01); *G01R 31/3648* (2013.01); *G06F 17/11* (2013.01)

(58) Field of Classification Search
CPC ............... G01R 31/367; G01R 31/392; G01R 31/3835; G06F 17/11
See application file for complete search history.

(56) References Cited

U.S. PATENT DOCUMENTS

| | | |
|---|---|---|
| 10,222,426 B2 | 3/2019 | Wang et al. |
| 2011/0054816 A1 | 3/2011 | Prada et al. |

(Continued)

FOREIGN PATENT DOCUMENTS

| | | |
|---|---|---|
| JP | 2005-524913 A | 8/2005 |
| JP | 5560154 B2 | 7/2014 |

(Continued)

OTHER PUBLICATIONS

Zhang et al., "Parallelized Genetic Identification of the Thermal-Electrochemical Model for Lithium-Ion Battery" Advances in Mechanical Engineering vol. 2013, Article ID 754653 (Year: 2013).*

*Primary Examiner* — John C Kuan
(74) *Attorney, Agent, or Firm* — NSIP Law

(57) ABSTRACT

A method with battery state estimation may include: generating a plurality of electrochemical-thermal (ECT) models corresponding to modeling conditions based on an arbitrary parameter of an ECT model configured to perform modeling of a battery; determining a target parameter of the ECT model based on an error between an actual state of the battery and a model-derived state of the battery obtained by a parallel operation of the plurality of ECT models; and estimating a state of the battery based on the target parameter.

21 Claims, 11 Drawing Sheets

(56) References Cited

U.S. PATENT DOCUMENTS

| | | | | |
|---|---|---|---|---|
| 2012/0316812 A1* | 12/2012 | Umeki | ............... | G01R 31/3842 |
| | | | | 702/63 |
| 2013/0116954 A1* | 5/2013 | Tazoe | .................. | G01R 31/367 |
| | | | | 702/63 |
| 2019/0187212 A1 | 6/2019 | Garcia et al. | | |
| 2019/0384876 A1* | 12/2019 | Tate, Jr. | .................. | G06F 30/20 |

FOREIGN PATENT DOCUMENTS

| | | |
|---|---|---|
| JP | 2015-135286 A | 7/2015 |
| KR | 10-2015-0034593 A | 4/2015 |
| KR | 10-2015-0084596 A | 7/2015 |
| KR | 10-2017-0076411 A | 7/2017 |
| KR | 10-2019-0040303 A | 4/2019 |

* cited by examiner

| Optimization method according to related art | Battery state estimation apparatus |
|---|---|
| [Epoch#0002, 77.906s] loss : 0.0465, best loss : 0.0465, max_dv: 0.4112<br>[Epoch#0003, 57.468s] loss : 2.1033, best loss : 0.0465, max_dv: 0.4112<br>[Epoch#0004, 51.421s] loss : 1.8776, best loss : 0.0465, max_dv: 0.4112<br>[Epoch#0005, 76.952s] loss : 0.3740, best loss : 0.0465, max_dv: 0.4112<br>[Epoch#0006, 30.681s] loss : 3.2157, best loss : 0.0465, max_dv: 0.4112<br>[Epoch#0007, 74.645s] loss : 0.7829, best loss : 0.0465, max_dv: 0.4112<br>[Epoch#0008, 67.397s] loss : 1.5059, best loss : 0.0465, max_dv: 0.4112<br>[Epoch#0009, 77.388s] loss : 0.0251, best loss : 0.0251, max_dv: 0.1956<br>[Epoch#0010, 70.660s] loss : 1.1976, best loss : 0.0251, max_dv: 0.1956 | [Epoch#0002, 5.912s] loss : 5.8872, best loss : 7.3424, max_dv: 4.1100<br>[Epoch#0003, 5.563s] loss : 6.0320, best loss : 7.3424, max_dv: 4.1100<br>[Epoch#0004, 5.227s] loss : 6.5915, best loss : 7.3424, max_dv: 4.1100<br>[Epoch#0005, 5.255s] loss : 6.3488, best loss : 7.3424, max_dv: 4.1100<br>[Epoch#0006, 6.440s] loss : 5.2346, best loss : 7.3424, max_dv: 4.1100<br>[Epoch#0007, 5.616s] loss : 6.0285, best loss : 7.3424, max_dv: 4.1100<br>[Epoch#0008, 5.468s] loss : 6.3378, best loss : 7.3424, max_dv: 4.1100<br>[Epoch#0009, 6.989s] loss : 0.2152, best loss : 0.2152, max_dv: 0.1949<br>[Epoch#0010, 6.271s] loss : 5.6393, best loss : 0.2152, max_dv: 0.1949 |
| Average execution time per optimization : 65.6sec | Average execution time per optimization : 5.9sec |

FIG. 5A

METHOD AND APPARATUS WITH BATTERY STATE ESTIMATION

CROSS-REFERENCE TO RELATED APPLICATIONS

This application claims the benefit under 35 USC § 119(a) of Korean Patent Application No. 10-2019-0158244 filed on Dec. 2, 2019, in the Korean Intellectual Property Office, the entire disclosure of which is incorporated herein by reference for all purposes.

BACKGROUND

1. Field

The following description relates to a battery state estimation method and apparatus.

2. Description of Related Art

To calculate an electrochemical-thermal (ECT) model in a battery state estimation method according to a related art, an experiment for internal parameters needing to be measured is conducted or reference has been made to documents about experiments that have been conducted in advance.

However, since a battery is an analog device that sensitively responds to a size of the battery or a composition ratio of materials included in the battery, an error may be present in a battery state estimation based on only experimental results. Thus, parameters that accurately simulate a battery are derived through a tuning task of a battery expert based on experimental results.

To derive parameters, generally a parameter that is sensitive to an estimation result, for example, an estimation voltage or a state of charge (SOC), of an ECT model is tuned first to reduce a great error, other additional parameters are tuned, and a parameter is finally determined.

In the above process, to measure an accuracy of a tuned parameter, an estimation voltage is calculated by applying a current to the ECT model set with the parameter, and is compared to a voltage actually measured by applying the same current to a real battery. A constant current charging and discharging method of performing charging or discharging with a constant current is usually used.

However, it is difficult to take into consideration all various current methods applied to the battery for the above parameter determination method by experts. In particular, since an ECT model includes hundreds of internal parameters and the above parameters are entangled in complex interrelationships, there is a limit to accurately deriving parameters by experts.

Thus, there is a demand for technologies of automatically deriving an internal factor of the ECT model.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method with battery state estimation includes: generating a plurality of electrochemical-thermal (ECT) models corresponding to modeling conditions based on an arbitrary parameter of an ECT model configured to perform modeling of a battery; determining a target parameter of the ECT model based on an error between an actual state of the battery and a model-derived state of the battery obtained by a parallel operation of the plurality of ECT models; and estimating a state of the battery based on the target parameter.

The modeling conditions may include a profile of a current input to the battery and an initial state of the battery.

The method may further include: determining the arbitrary parameter within a parameter range that is determined in advance based on the modeling conditions.

The method may further include: receiving the actual state of the battery, wherein the actual state of the battery is measured based on the modeling conditions.

The generating of the plurality of ECT models may include generating the plurality of ECT models by replicating the ECT model with the arbitrary parameter.

The determining of the target parameter may include: assigning a first modeling condition included in the modeling conditions to a first ECT mode included in the plurality of ECT models; assigning a second modeling condition included in the modeling conditions to a second ECT model included in the plurality of ECT models; estimating the state of the battery based on the first ECT model; estimating the state of the battery based on the second ECT model; and determining the target parameter based on a first error between the actual state of the battery and the state of the battery as estimated based on the first ECT model, and a second error between the actual state of the battery and the state of the battery as estimated based on the second ECT model. The estimating of the state of the battery based on the first ECT model and the estimating of the state of the battery based on the second ECT model may be performed in parallel.

The determining of the target parameter based on the first error and the second error may include: merging the first error and the second error; calculating a value of an objective function based on the merged first and second errors; and determining, as the target parameter, a parameter that minimizes the value of the objective function.

The determining of the target parameter may include: generating a first candidate parameter based on the plurality of ECT models; generating a second candidate parameter based on the plurality of ECT models; and determining the target parameter based on the first candidate parameter and the second candidate parameter.

The first candidate parameter and the second candidate parameter may be generated in parallel.

The generating of the first candidate parameter may include: estimating first states of the battery in parallel based on the plurality of ECT models; and determining, as the first candidate parameter, a parameter that minimizes an objective function that is based on errors between the actual state of the battery and the estimated first states of the battery. The generating of the second candidate parameter may include: estimating second states of the battery in parallel based on the plurality of ECT models; and determining, as the second candidate parameter, a parameter that minimizes an objective function based on errors between the actual state of the battery and the estimated second states of the battery.

In another general aspect, a non-transitory computer-readable storage medium stores instructions that, when executed by a processor, cause the processor to perform the method described above.

In another general aspect, an apparatus with battery state estimation includes a processor and a memory. The processor is configured to: generate a plurality of electrochemical-thermal (ECT) models corresponding to modeling conditions based on an arbitrary parameter of an ECT model configured to perform modeling of a battery; determine a target parameter of the ECT model based on an error between an actual state of the battery and a model-generated state of the battery obtained by a parallel operation of the plurality of ECT models; and estimate a state of the battery based on the target parameter. The memory is configured to store an instruction executed by the processor to generate the plurality of ECT models, determine the target parameter of the ECT model, and estimate the state of the battery.

The modeling conditions may include a profile of a current input to the battery and an initial state of the battery.

The processor may be further configured to determine the arbitrary parameter within a parameter range that is determined in advance based on the modeling conditions.

The processor may be further configured to receive the actual state of the battery, the actual state of the battery being measured based on the modeling conditions.

The processor may be further configured to generate the plurality of ECT models by replicating the ECT model with the arbitrary parameter.

The processor may include: a first core corresponding to a first ECT model included in the plurality of ECT models; and a second core corresponding to a second ECT model included in the plurality of ECT models. The first core may be configured to assign a first modeling condition included in the modeling conditions to the first ECT model and to estimate the state of the battery based on the first ECT model. The second core may be configured to assign a second modeling condition included in the modeling conditions to the second ECT model and to estimate the state of the battery based on the second ECT model. The processor may be further configured to determine the target parameter based on a first error between the actual state of the battery and the state of the battery as estimated by the first core, and a second error between the actual state of the battery and the state of the battery as estimated by the second core. The first core and the second core may estimate the state of the battery in parallel.

The processor may be further configured to: merge the first error and the second error; calculate a value of an objective function based on the merged first and second errors; and determine, as the target parameter, a parameter that minimizes the value of the objective function.

The processor may include: a first sub-processor configured to generate a first candidate parameter based on the plurality of ECT models; and a second sub-processor configured to generate a second candidate parameter based on the plurality of ECT models. The processor may be further configured to determine the target parameter based on the first candidate parameter and the second candidate parameter.

The first candidate parameter and the second candidate parameter may be generated in parallel.

The first sub-processor may be further configured to: estimate, using a first plurality of cores, first states of the battery in parallel based on the plurality of ECT models; and determine, as the first candidate parameter, a parameter that minimizes an objective function that is based on errors between the actual state of the battery and the estimated first states of the battery. The second sub-processor may be configured to: estimate, using a second plurality of cores, second states of the battery in parallel based on the plurality of ECT models; and determine, as the second candidate parameter, a parameter that minimizes an objective function based on errors between the actual state of the battery and the estimated second states of the battery.

Other features and aspects will be apparent from the following detailed description, the drawings, and the claims.

BRIEF DESCRIPTION OF THE DRAWINGS

FIG. 5A illustrates an example of a result obtained by a comparison of a parameter optimization execution time between a parameter optimization method according to a related art, and an optimization process of the battery state estimation apparatus of FIG. 1.

Figure 1:
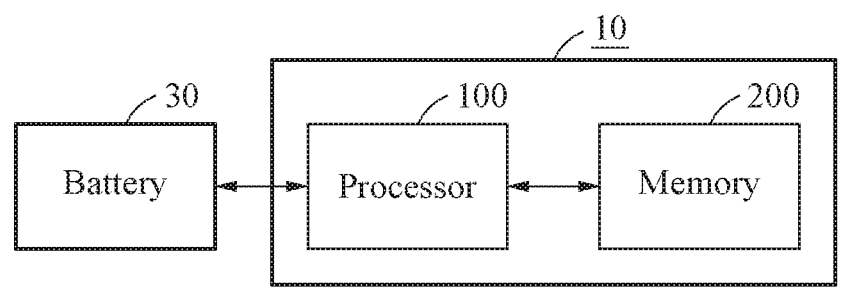
FIG. 1 illustrates an example of a battery state estimation apparatus.

Throughout the drawings and the detailed description, the same drawing reference numerals refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 illustrates an example of a battery state estimation apparatus 10.

Referring to FIG. 1, the battery state estimation apparatus 10 estimates a state of a battery 30. The battery 30 converts chemical energy into electricity, stores the electricity and generates a current to supply power to an electric device.

The battery state estimation apparatus 10 may estimate the state of the battery 30 using an electrochemical-thermal (ECT) model. The state of the battery 30 includes, for example, a voltage of the battery 30 with respect to a current and a temperature. Also, the state of the battery 30 includes, for example, a state of health (SOH) and a state of charge (SOC) of the battery 30.

The ECT model includes a computer information structure that mathematically expresses electrical and chemical reactions occurring in the battery 30. The ECT model performs modeling of physical dynamics of an operation of the battery 30.

The ECT model performs a modeling of the battery 30 using various parameters. Parameters of the ECT model may mathematically represent dynamics of an oxidation, a reduction and a conduction of ions during charging and discharging of the battery 30.

Parameters of the ECT model may include, for example, a current density, an electrode potential, an ion mobility, an internal temperature of the battery 30, or a voltage applied to the battery 30. Also, the parameters of the ECT model may further include an area of an electrode, an SOC-open circuit voltage (OCV) and a diffusion coefficient.

At least about four hundred (400) parameters among internal parameters of the ECT model may be obtained by experiments. However, a parameter obtained by an experiment may require an optimization process due to a human error or a model error.

The parameters of the ECT model are closely related to each other, and accordingly an optimization to satisfy all conditions at the same time may be necessary.

An optimization problem may be a problem of finding parameter information that correlate with each other and that satisfy a predetermined condition. The battery state estimation apparatus 10 may determine a parameter of the ECT model using an optimization problem solving method.

The battery state estimation apparatus 10 may find a parameter that minimizes or maximizes a result of an objective function from innumerable possible combinations of parameter values.

For example, the battery state estimation apparatus 10 may optimize a parameter by minimizing a value of a loss function or an objective function (cost function) of the ECT model. For example, the value of the objective function may minimize a difference between an actually measured voltage of the battery 30 and a voltage of the battery 30 estimated using the ECT model.

In this example, the ECT model is a model that mimics the battery 30, and currents of various conditions may be applied to the battery 30 under various temperature conditions. Thus, to find an optimal parameter, an external factor, for example, a current or a temperature, may need to be maximally taken into consideration.

When a parameter is derived only under a portion of conditions, for example, constant current charging and discharging conditions, the derived parameter may have a possibility of malfunctioning when the battery is mounted in an actual device. Thus, actual conditions of various cases may need to be maximally taken into consideration.

The battery state estimation apparatus 10 may determine a target parameter that is based on a modeling condition, for example, a current applying method such as a profile of a current, of various cases in a parameter optimization process.

In a parameter optimization method according to a related art, when a number of modeling conditions under consideration increases, an amount of time required for optimization increases. Thus, a large amount of time may be required to derive a parameter achieving an objective function.

The battery state estimation apparatus 10 may quickly perform an optimization process even though various programs are applied, through a parallel operation using a plurality of ECT models.

The battery state estimation apparatus 10 includes, for example, a processor 100 and a memory 200.

The processor 100 processes data stored in the memory 200. The processor 100 executes computer-readable code, for example, software, stored in the memory 200 and instructions caused by the processor 100.

The term "processor," as used herein, may be a hardware-implemented data processing device having a circuit that is physically structured to execute desired operations. For example, the desired operations may include code or instructions included in a program. The hardware-implemented data processing device may include, but is not limited to, for example, a microprocessor, a central processing unit (CPU), a processor core, a multi-core processor, a multiprocessor, an application-specific integrated circuit (ASIC), or a field-programmable gate array (FPGA).

The processor 100 may include a plurality of sub-processors. Each of the sub-processors may include a plurality of cores. Each of the sub-processors and/or each of the cores may be implemented as a separate processor.

The processor 100 may optimize parameters in parallel using the ECT models and either one or both of the sub-processors and the cores, to accurately estimate the state of the battery 30.

An operation of estimating the state of the battery 30 using the cores will be further described below with reference to FIG. 3, and an operation of estimating the state of the battery 30 using the sub-processors will be further described below with reference to FIG. 4.

The memory 200 stores instructions or programs executed by the processor 100. For example, instructions may include instructions to perform an operation of the processor 100 and/or an operation of each component of the processor 100.

The memory 200 may be implemented as a volatile memory device or nonvolatile memory device. The volatile memory device may be a dynamic random access memory (DRAM), a static random access memory (SRAM), a thyristor RAM (T-RAM), a zero capacitor RAM (Z-RAM), or a twin transistor RAM (TTRAM). The nonvolatile memory device may be an electrically erasable programmable read-only memory (EEPROM), a flash memory, a magnetic RAM (MRAM), a spin-transfer torque (STT)-MRAM, a conductive bridging RAM (CBRAM), a Ferroelectric RAM (FeRAM), a phase-change RAM (PRAM), a resistive RAM (RRAM), a nanotube RRAM, a polymer RAM (PoRAM), a nano-floating gate memory (NFGM), a holographic memory, a molecular electronic memory device, or an insulator resistance change memory.

Hereinafter, an example of an overall operation of a battery state estimation apparatus is described with reference to FIG. 2.

Figure 2:
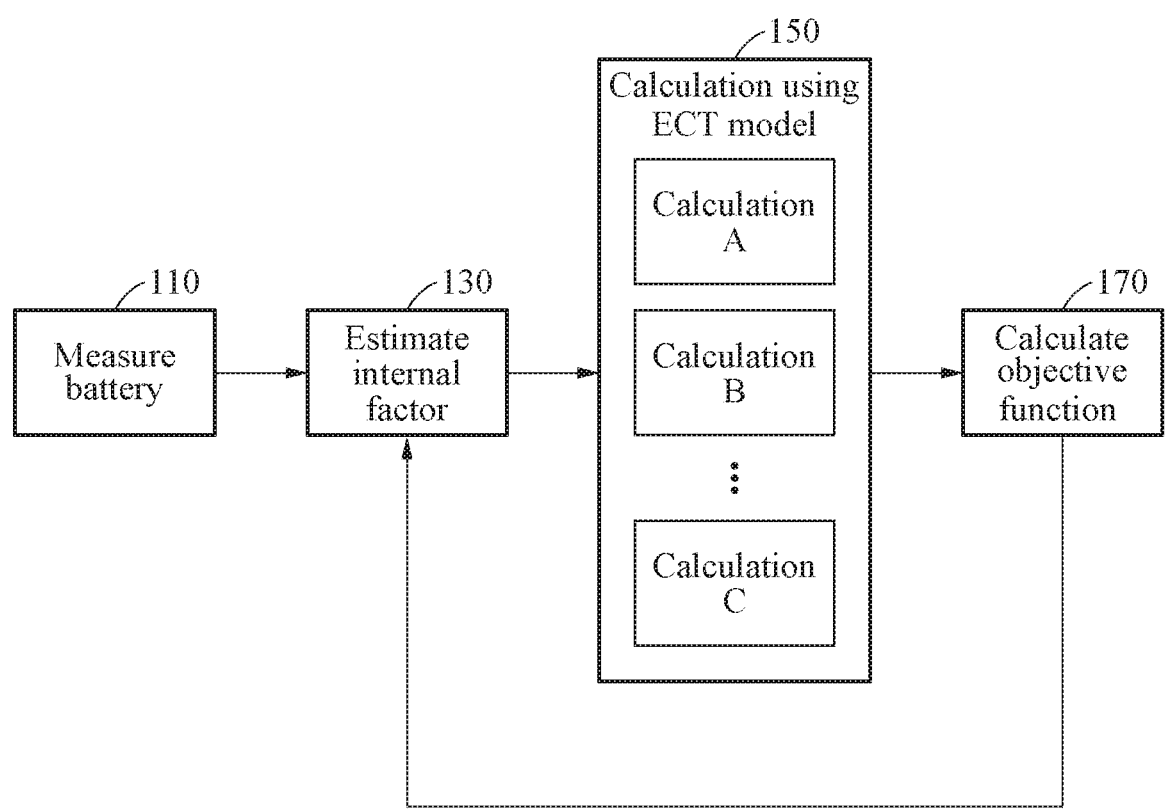
FIG. 2 illustrates an example of an operation of the battery state estimation apparatus of FIG. 1.

FIG. 2 illustrates an example of an operation of the battery state estimation apparatus 10 of FIG. 1. Referring to FIG. 2, the battery state estimation apparatus 10 may reduce a time required for an optimization while taking into consideration various modeling conditions in a process of searching for a parameter of the ECT model using an optimization algorithm.

In a charging/discharging experiment of the battery 30, currents applied in the past may continue to have an influence on a future state of the battery 30. Thus, when a state of a next point in time is estimated based on information of a predetermined point in time during an experiment, a great error may occur.

Thus, to perform an experiment for analyzing a characteristic of the battery 30, a relaxation state in which a parameter of the battery 30 remains unchanged during a break time before a start of the experiment and after an end of the experiment may be created. Through the relaxation state, information about a current applied to the battery 30 immediately before the experiment, a voltage corresponding to the current, and a temperature may independently exist, because the information does not have correlation based on different modeling conditions.

Under a relaxation condition, the same result as a result obtained by sequentially performing calculations may be obtained, even though an internal factor of the same ECT model is set and different currents are applied independently to calculate a parameter of the battery.

Before a parameter optimization is performed, the processor 100 measures the battery 30 in operation 110. For example, the processor 100 may generate a plurality of modeling conditions by performing, in advance, an experiment of the actual battery 30 for the number of cases of various profiles that may be applied to the battery 30.

For example, "N" modeling conditions may be generated, wherein N is an integer greater than or equal to 2. A modeling condition may include a profile of a current and initial state information of the battery 30, an actually measured voltage of the battery 30 based on the profile, and temperature information of the battery 30.

For example, before "N" experiments are performed, the processor 100 may acquire the initial state information, profile information, the actually measured voltage of the battery 30 based on the profile, and the temperature information. In this example, the plurality of modeling conditions may have different profiles of currents.

In operation 130, the processor 100 estimates an internal factor or parameter of the battery 30. The internal factor is the above-described parameter. The processor 100 may determine an initial value of a parameter of an arbitrary ECT model using the optimization algorithm.

The processor 100 may determine a range that may include parameter values based on a knowledge of the state of the battery 30, and may determine an arbitrary parameter within the determined range.

The processor 100 may determine an arbitrary parameter within the determined range, based on a plurality of modeling conditions. For example, the processor 100 may determine an arbitrary parameter that may minimize an error between an actual state of the battery 30 and a state of the battery 30 acquired from the ECT model using the optimization algorithm within the determined range, based on a measurement experiment result of the battery 30.

In operation 150, the processor 100 performs a calculation using the ECT model. The processor 100 estimates the state of the battery 30 using the ECT model of the battery 30.

To verify a degree by which an objective function is optimized by an arbitrary parameter, the processor 100 may assign the parameter to the ECT model and may replicate the ECT model with the assigned parameter to generate "N" ECT models. As described above, "N" is the number of modeling conditions.

The processor 100 assigns different modeling conditions to replicated ECT models and estimates the state of the battery 30. For example, the processor 100 may differently assign a profile including a combination of initial state information, a current, a voltage and a temperature measured when "N" experiments are actually performed to each of the replicated ECT models, and may estimate states, for example, a voltage or an SOC, of the battery 30 in parallel.

The processor 100 returns a cumulative value (for example, a cumulative error value) of a difference between an estimated state obtained as a result of the parallel operation and an actually measured state (for example, a voltage or an SOC) of the battery 30, and length information of a profile corresponding to the estimated state of the battery.

In operation 170, the processor 100 calculates a value of an objective function based on the calculated error. The processor 100 calculates the value of the objective function using cumulative error values based on a plurality of profiles calculated above. For example, the processor 100 may calculate the value of the objective function based on a root mean square error (RMSE) or a max absolute error (MAE).

The processor 100 generates a next parameter that may reduce an error based on a parameter applied to a current ECT model and error information. The processor 100 repeatedly performs determining of a parameter of the battery 30 using the optimization algorithm and calculating of an error using the ECT model and the objective function.

When a value of the objective function calculated using a determined parameter satisfies a threshold condition, the processor 100 may determine the parameter as a target parameter. In other words, the target parameter may be a finally determined parameter.

Hereinafter, examples of a battery state estimation process of FIG. 2 are further described with reference to FIGS. 3 and 4.

Figure 3:
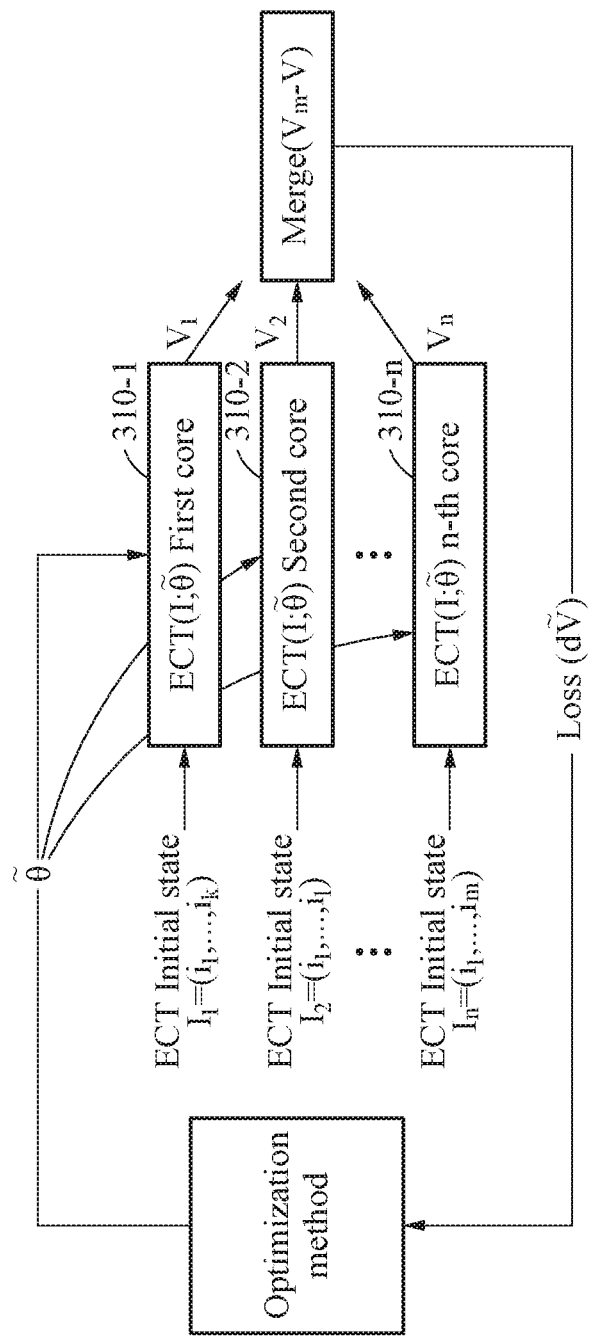
FIGS. 3 and 4 illustrate example optimization processes through a parallel operation of the battery state estimation apparatus of FIG. 1.

FIG. 3 illustrates an example of an optimization process through a parallel operation of the battery state estimation apparatus 10 of FIG. 1. Referring to FIG. 3, as described above, an optimization of a parameter is, for example, a process of changing a parameter of an ECT model to minimize an error between an actual state of the battery 30 and a state of the battery 30 that is estimated using the ECT model.

The processor 100 receives an actual state of the battery 30 measured based on a plurality of modeling conditions. A process by which the processor 100 measures the actual state of the battery 30 is the same as that described with reference to FIG. 2.

The modeling conditions include a profile of a current input to the battery 30 and an initial state of the battery 30. For example, the modeling conditions may include different current profiles and/or different initial states, respectively.

The processor 100 may determine an arbitrary parameter within a parameter range determined in advance based on the modeling conditions. The parameter range may be experimentally determined.

The processor 100 generates ECT models corresponding to the modeling conditions, based on an arbitrary parameter of an ECT model that performs modeling of the battery 30.

The processor 100 generates the ECT models by replicating the ECT model with the determined parameter. For example, the ECT models may be configured to have initial values of the same parameters.

The processor 100 determines a target parameter of the ECT model based on an error between the actual state of the battery 30 and a state of the battery 30 that is acquired or estimated through a parallel operation of the ECT models.

The processor 100 assigns different modeling conditions to the ECT models to perform an optimization of a parameter. The processor 100 estimates the state of the battery 30 in parallel using different cores and/or sub-processors respectively corresponding to the plurality of ECT models.

For example, the ECT models may include a first ECT model and a second ECT model. According to examples, a number of ECT models may be greater than or equal to three. In the following description, for convenience of description, two ECT models are provided.

In examples in which at least three ECT models are provided, a target parameter may be determined in the same manner as in the following example including two ECT models.

Referring to FIG. 3, the processor 100 may include a first core 310-1 and a second core 310-2. When the number of ECT models is greater than or equal to three, a number of cores may also be greater than or equal to three, and may directly correspond to the number of ECT models.

The processor 100 includes n cores. n is a natural number greater than or equal to "2". For example, the processor 100 includes the first core 310-1, the second core 310-2 and an n-th core 310-*n*.

Each core 310-1 to 310-*n* estimates the state of the battery 30 using a single ECT model. Although the state of the battery 30 is a voltage in the examples of FIGS. 3 and 4, the state of the battery 30 may further include an SOC and/or an SOH as described above.

The first core 310-1 corresponds to a first ECT model included in the ECT models, and the second core 310-2 corresponds to a second ECT model included in the ECT models.

The processor 100 may assign a first modeling condition and a second modeling condition included in the modeling conditions to the first ECT model and the second ECT model, respectively.

In other words, the first modeling condition may be assigned to the first ECT model, and the second modeling condition may be assigned to the second ECT model. The first modeling condition and the second modeling condition are different from each other.

The first core 310-1 estimates the state of the battery 30 based on the first ECT model to which the first modeling condition is assigned. The second core 310-2 estimates the state of the battery 30 based on the second ECT model to which the second modeling condition is assigned. The estimating operation of the first core 310-1 and the estimating operation of the second core 310-2 are performed in parallel, for example.

The processor 100 receives an estimation result obtained by estimating the state of the battery 30 from each core. The processor 100 calculates a first error between the actual state of the battery 30 and the state of the battery 30 as estimated based on the first ECT model. The processor 100 calculates a second error between the actual state of the battery 30 and the state of the battery 30 as estimated based on the second ECT model.

The processor 100 determines a target parameter based on the first error and the second error. For example, the processor 100 merges the first error and the second error. The processor 100 may calculate a value of an objective function based on the merged first and second errors.

For example, the processor 100 may accumulate errors by accumulating estimation results that are obtained by estimating the state of the battery 30 and received from the plurality of cores.

In this example, the processor 100 may acquire length information associated with a profile of the state of the battery 30.

The processor 100 determines the target parameter to minimize the value of the objective function. That is, the processor 100 determines, as the target parameter, a parameter that minimizes the objective function. The objective function may include, for example, a cost function or a loss function. Hereinafter, an example in which the objective function is a loss function is described.

The loss function may include, for example, an RMSE or a MAE.

The processor 100 may update an arbitrary parameter that is initially applied to an ECT model based on a calculated value of the objective function. The processor 100 estimates the state of the battery 30 based on the ECT models in the same manner as that described above based on the updated parameter, calculates errors from the estimated state and merges the errors.

The processor 100 calculates the value of the objective function based on a newly calculated error, and updates a parameter to reduce the value of the objective function using an optimization algorithm. The processor 100 repeatedly performs the above operation until the value of the objective function is minimized.

The optimization algorithm may include, for example, a Bayesian optimization algorithm. The Bayesian optimization algorithm may include, for example, a Gaussian process (GP) algorithm and a tree Parzen estimation (TPE) algorithm.

The processor 100 may repeat an updating of a parameter a predetermined number of times. For example, when the value of the objective function is less than or equal to a threshold, the processor 100 may interrupt the updating of the parameter. When repeating of the updating of the parameter ends, the processor 100 may determine a parameter that minimizes the value of the objective function as a target parameter.

Figure 4:
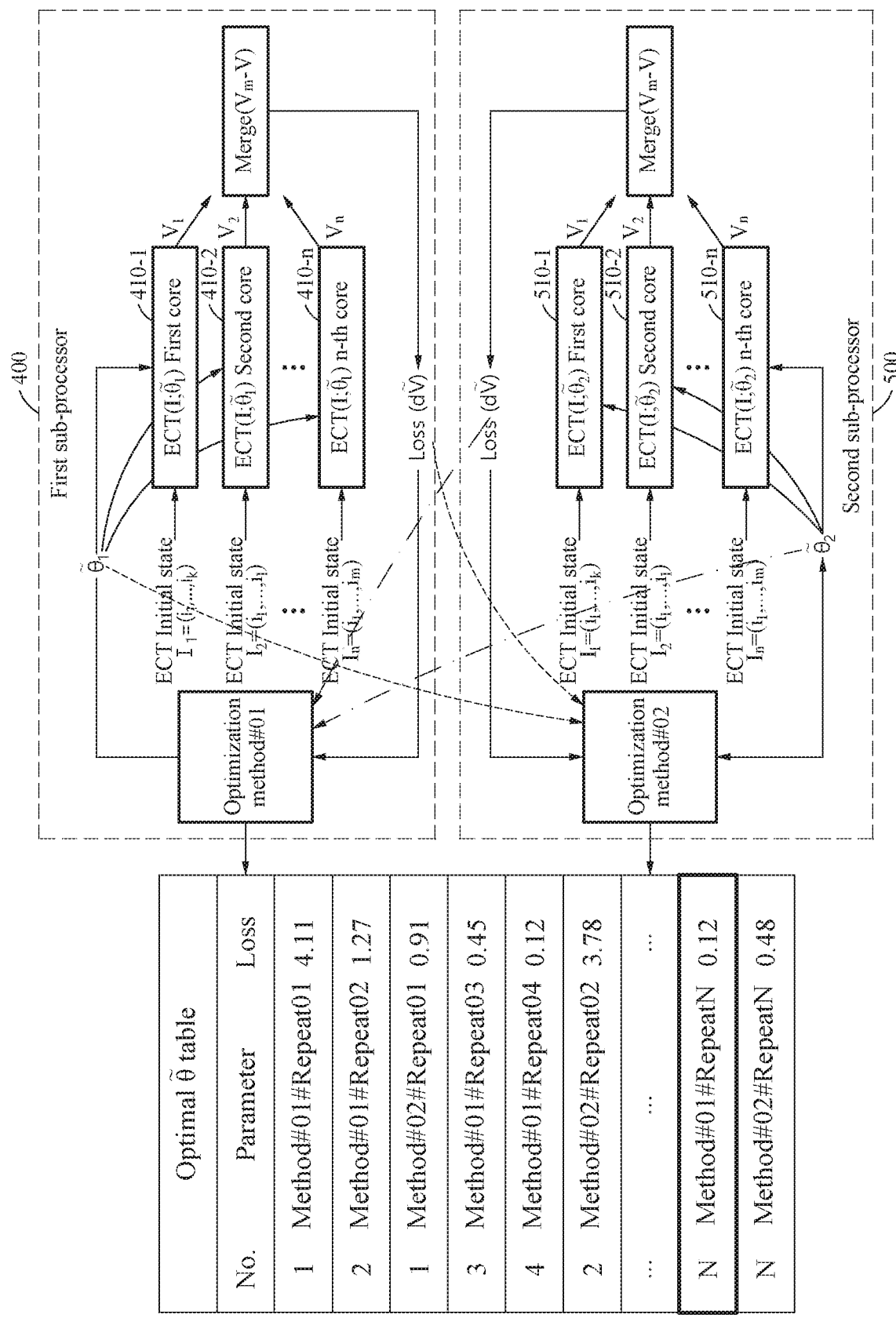

FIG. 4 illustrates an optimization process through a parallel operation of the battery state estimation apparatus 10 of FIG. 1. Referring to FIG. 4, the processor 100 may generate a plurality of candidate parameters in parallel using a plurality of sub-processors based on different optimization algorithms, and determine a target parameter based on the generated candidate parameters.

For example, the processor 100 includes a first sub-processor 400 and a second sub-processor 500. Each of the first sub-processor 400 and the second sub-processor 500 includes a plurality of cores.

For example, the first sub-processor 400 includes a first core 410-1, a second core 410-2 and an n-th core 410-n, and the second sub-processor 500 includes a first core 510-1, a second core 510-2 and an n-th core 510-n.

The first sub-processor 400 generates a first candidate parameter based on a plurality of ECT models to which a plurality of modeling conditions are assigned. A process of generating the first candidate parameter may be the same as the above-described process of determining the target parameter using the plurality of cores.

The first sub-processor 400 may estimate a plurality of states of the battery 30 in parallel using a plurality of cores (e.g., cores 410-1 through 410-n) based on the ECT models to which the modeling conditions are assigned.

The first sub-processor 400 determines the first candidate parameter to minimize an objective function that is based on errors between an actual state of the battery 30 and states of the battery 30 that are estimated in parallel, respectively.

The second sub-processor 500 generates a second candidate parameter based on the ECT models to which the modeling conditions are assigned. A process of generating the second candidate parameter is also the same as the above-described process of determining the target parameter using the plurality of cores.

The second sub-processor 500 estimates a plurality of states of the battery 30 in parallel using a plurality of cores (e.g., cores 510-1 through 510-n) based on the plurality of ECT models to which the plurality of modeling conditions are assigned.

The second sub-processor 500 determines the second candidate parameter to minimize an objective function that is based on errors between the actual state of the battery 30 and the states of the battery 30 that are estimated in parallel, respectively.

A parameter optimization algorithm used to generate the first candidate parameter and a parameter optimization algorithm used to generate the second candidate parameter may be identical to or different from each other.

The first candidate parameter and the second candidate parameter may be generated in parallel. For example, the first sub-processor 400 and the second sub-processor 500 may perform different optimization algorithms in parallel to generate candidate parameters.

The processor 100 determines a target parameter based on the first candidate parameter and the second candidate parameter. For example, the processor 100 may determine, as a target parameter, one of the first candidate parameter and the second candidate parameter which allows the objective function to have a smaller value.

The processor 100 estimates the state of the battery 30 based on the determined target parameter.

Hereinafter, examples of a comparison result of a performance between the battery state estimation apparatus 10 of FIG. 1 and a method according to a related art will be described with reference to FIGS. 5A, 5B. 6A and 6B.

Figure 5B:
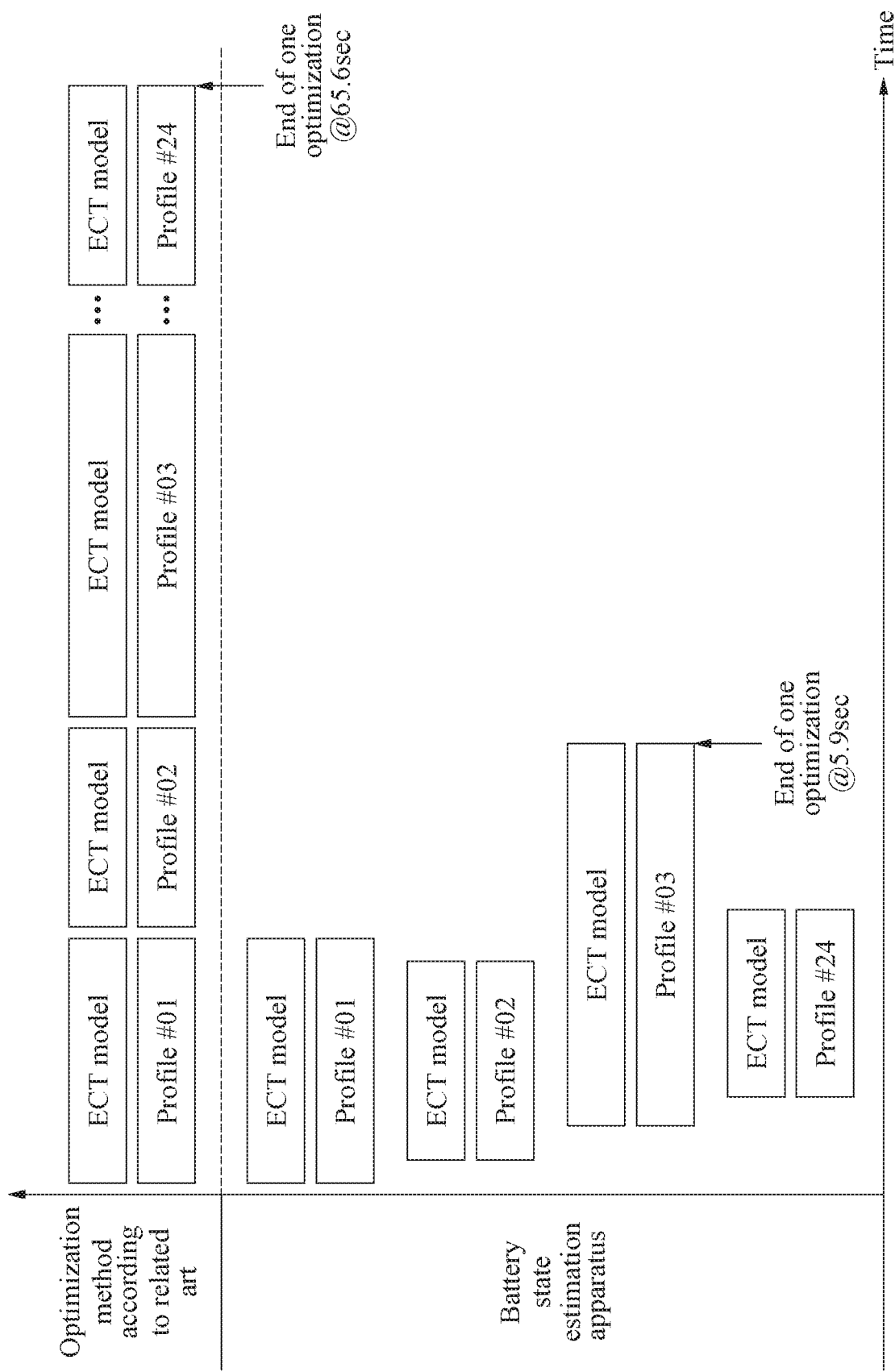
FIG. 5B illustrates an example of a comparison between the parameter optimization method according to the related art and the optimization process of the battery state estimation apparatus of FIG. 1.

FIG. 5A illustrates an example of a result obtained by a comparison of a parameter optimization execution time between a parameter optimization method according to the related art, hereinafter, referred to as a conventional optimization method, and an optimization process of the battery state estimation apparatus 10 of FIG. 1. FIG. 5B illustrates an example of a comparison between the conventional optimization method and the optimization process of the battery state estimation apparatus 10.

Referring to FIGS. 5A and 5B, results obtained by comparing a time for optimizing parameters in the battery state estimation apparatus 10 and a time for optimizing parameters in the conventional optimization method are confirmed.

FIGS. 5A and 5B show results obtained by comparing a time required to estimate the state of the battery 30 through a parallel operation by the battery state estimation apparatus 10 to a time required to perform the conventional optimization method of calculating a state of a battery using an ECT model sequentially for 24 types of discharging profiles with different lengths and calculating an objective function.

As shown in FIGS. 5A and 5B, it is found that an execution time per optimization of the conventional optimization method is about 11 times the execution time per optimization of the optimization process of the battery state estimating apparatus 10.

A value of a time required for an optimization is greatly affected by a profile having a maximum length among current profiles included in a modeling condition.

An execution time per optimization of the battery state estimation apparatus 10 may be almost equal to an execution time of an ECT model corresponding to the profile having the maximum length.

For example, when profiles have similar lengths and when a large number of profiles is provided, a speed difference between the conventional optimization method and the optimization process of the battery state estimating apparatus 10 may further increase.

The execution time per optimization of the battery state estimation apparatus 10 may not greatly change even though the number of profiles increases due to various profiles. Thus, the battery state estimation apparatus 10 may not increase a temporal loss even though the number of profiles increases in a server device or a computer with recent high-performance hardware.

In the conventional optimization method, an amount of time to be consumed increases in proportion to an increase in a total number of profiles used for estimation. However, the battery state estimation apparatus 10 may reduce a parameter optimization time when a number of cores in which simultaneous operation is possible all at once increases.

In an example, when the number of profiles is less than a number of cores that may simultaneously perform calculations all at once in the battery state estimation apparatus 10, a time for one calculation may be determined by a profile with a longest single time.

In another example, when the number of profiles is greater than twice a number of cores that may simultaneously perform calculations all at once, an execution time required for one optimization may be twice the longest profile.

When lengths of profiles are allowed to be maximally similar in a modeling condition for an optimization of a battery parameter, a temporal gain of the battery state estimation apparatus 10 may be maximized.

Figure 6A:
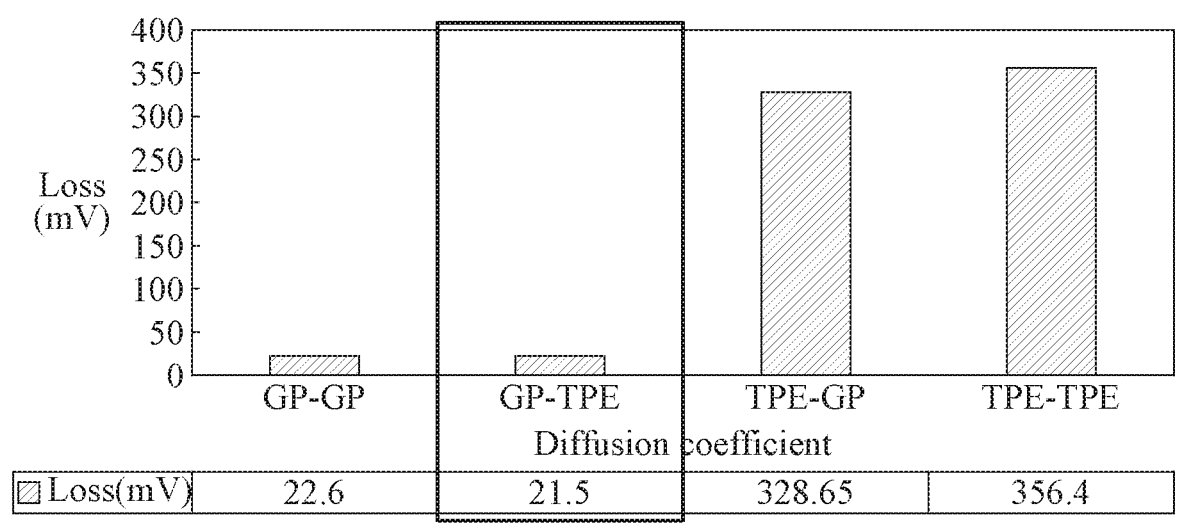
FIG. 6A illustrates an example of a comparison of a performance based on an optimization algorithm of the battery state estimation apparatus of FIG. 1.
Figure 6B:
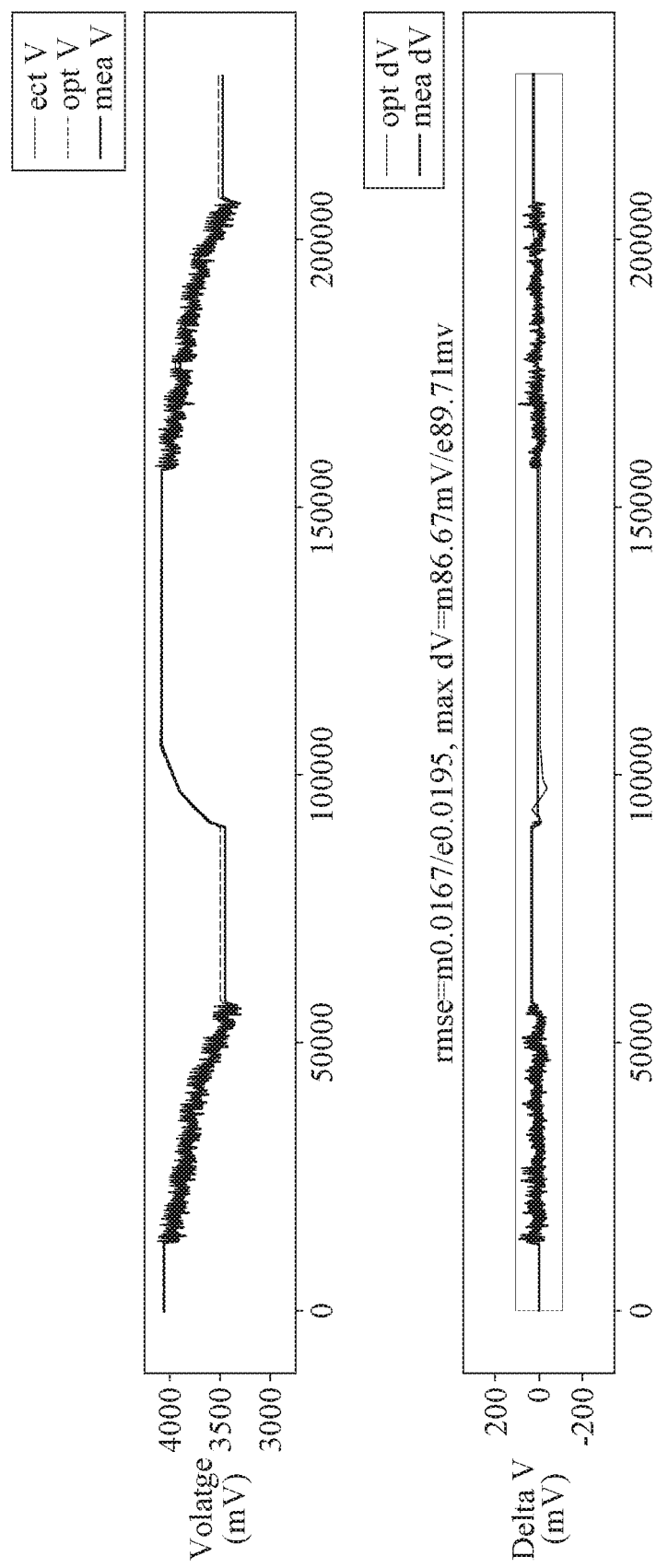
FIG. 6B illustrates an example of a result obtained by estimating a state of a battery using an optimized parameter determined by the battery state estimation apparatus of FIG. 1.

FIG. 6A illustrates an example of a result obtained by comparing a performance based on the optimization algorithm of the battery state estimation apparatus 10 of FIG. 1, and FIG. 6B illustrates an example of a result obtained by estimating a state of a battery using an optimized parameter by the battery state estimation apparatus 10.

Referring to FIGS. 6A and 6B, a performance of an example in which the plurality of sub-processors of FIG. 4 generate a plurality of candidate parameters using the same optimization algorithm or different optimization algorithms and determine a target parameter is verified.

An optimization algorithm used in an experiment may include, for example, a Bayesian optimization algorithm. The Bayesian optimization algorithm may include, for example, a GP algorithm and a TPE algorithm.

Also, in the examples of FIGS. 6A and 6B, ninety-six (96) types of input current profiles are used. After a constant value of a parameter is optimized for each optimization algorithm, a constant included in the parameter is fixed and a parallel optimization for a diffusion coefficient is performed.

FIG. 6A illustrates results obtained by performing a parallel optimization using two optimization algorithms. In a graph of FIG. 6A, a first result shows that both the first sub-processor 400 and the second sub-processor 500 use the GP algorithm to generate a first candidate parameter and a second candidate parameter, respectively.

A second result of FIG. 6A shows that the first sub-processor 400 uses the GP algorithm to generate a first candidate parameter and that the second sub-processor 500 uses the TPE algorithm to generate a second candidate parameter.

A third result of FIG. 6A shows that the first sub-processor 400 uses the TPE algorithm to generate a first candidate parameter and that the second sub-processor 500 uses the GP algorithm to generate a second candidate parameter.

A fourth result of FIG. 6A shows that both the first sub-processor 400 and the second sub-processor 500 use the TPE algorithm to generate a first candidate parameter and a second candidate parameter, respectively.

In the above experiments, it is confirmed that an objective function, for example, a loss function, is minimized when the first sub-processor 400 uses the GP algorithm and the second sub-processor 500 uses the TPE algorithm.

A time required to derive an optimal parameter using a combination of algorithms having a minimum objective function value is shown in Table 1 below.

TABLE 1

| | Battery state estimation apparatus (Using two optimization algorithms) | Battery state estimation apparatus (Using one optimization algorithm) | Sequential optimization method according to related art |
|---|---|---|---|
| Time | 4.8 days | >10 days | >110 days |

Referring to FIG. 6B, an optimization result is performed based on an actual current profile for a vehicle using a plurality of sub-processors based on a combination of GP and TPE algorithms. In FIG. 6B, the battery state estimation apparatus 10 acquires an estimation result that is very similar to the actual state of the battery 30.

Figure 7:
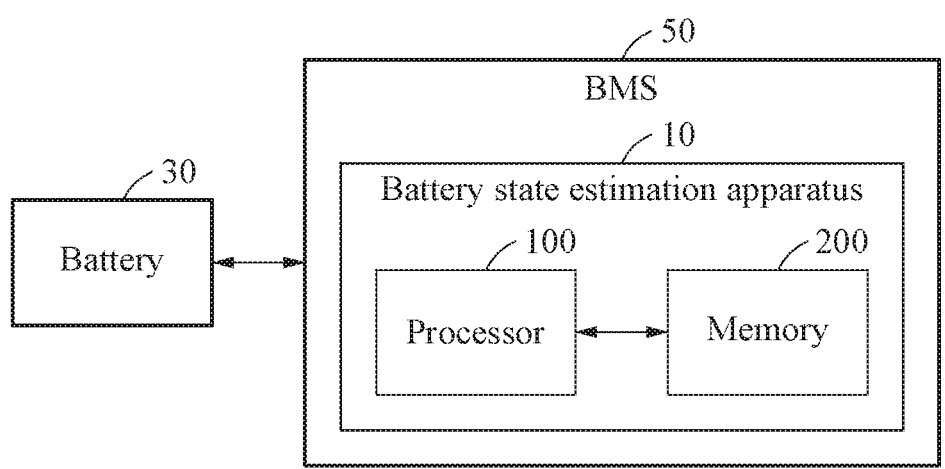
FIGS. 7 and 8 illustrate example implementations of the battery state estimation apparatus of FIG. 1.
Figure 8:
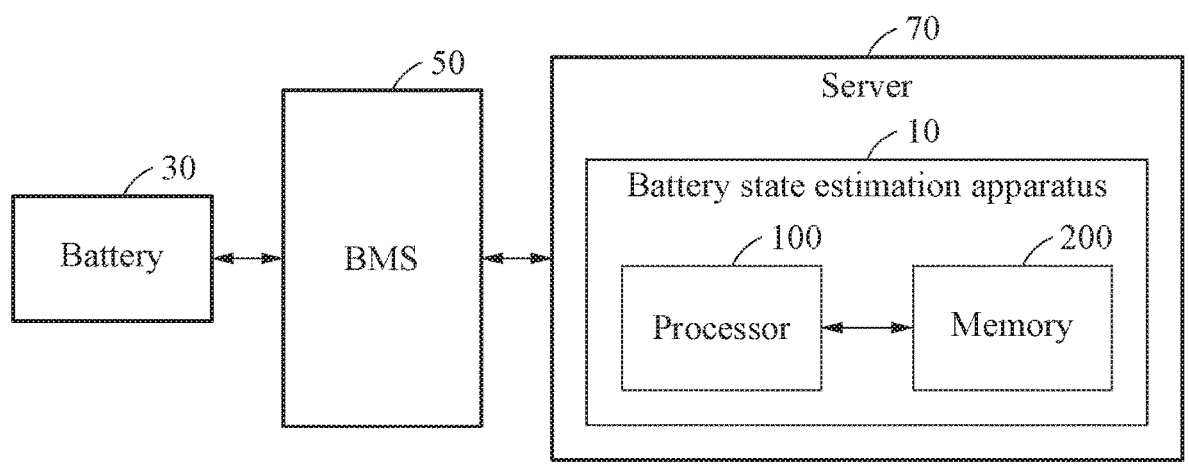

FIGS. 7 and 8 illustrate examples of implementations of the battery state estimation apparatus 10 of FIG. 1.

Referring to FIGS. 7 and 8, a battery management system (BMS) 50 maintains an optimal state of the battery 30 while monitoring a voltage, a current, and a temperature of the battery 30, and manages the battery 30 by predicting a time to replace the battery 30 and by detecting a problem occurring in the battery in advance.

As shown in FIGS. 7 and 8, the battery state estimation apparatus 10 may be included in the BMS 50 or implemented outside the BMS 50. The battery state estimation apparatus 10 may be included in the BMS 50 to estimate the state of the battery 30 and provide an estimation result to the BMS 50.

As shown in FIG. 7, the battery state estimation apparatus 10 is included in the BMS 50 to optimize a parameter of an ECT model. The battery state estimation apparatus 10 provides the optimized parameter to the BMS 50. The battery state estimation apparatus 10 estimates the state of the battery 30 based on the optimized parameter.

As shown in FIG. 8, the battery state estimation apparatus 10 is included in a server 70 outside the BMS 50, receives information about the battery 30 from the BMS 50, and estimates the state of the battery 30 based on the received information.

The battery state estimation apparatus 10 receives information about the voltage, the current or the temperature of the battery 30 from the BMS 50, and optimizes a parameter of an ECT model.

Also, the battery state estimation apparatus 10 transmits the optimized parameter to the BMS 50, estimates the state of the battery 30 and transmits the estimated state of the battery 30 to the BMS 50.

Figure 9:
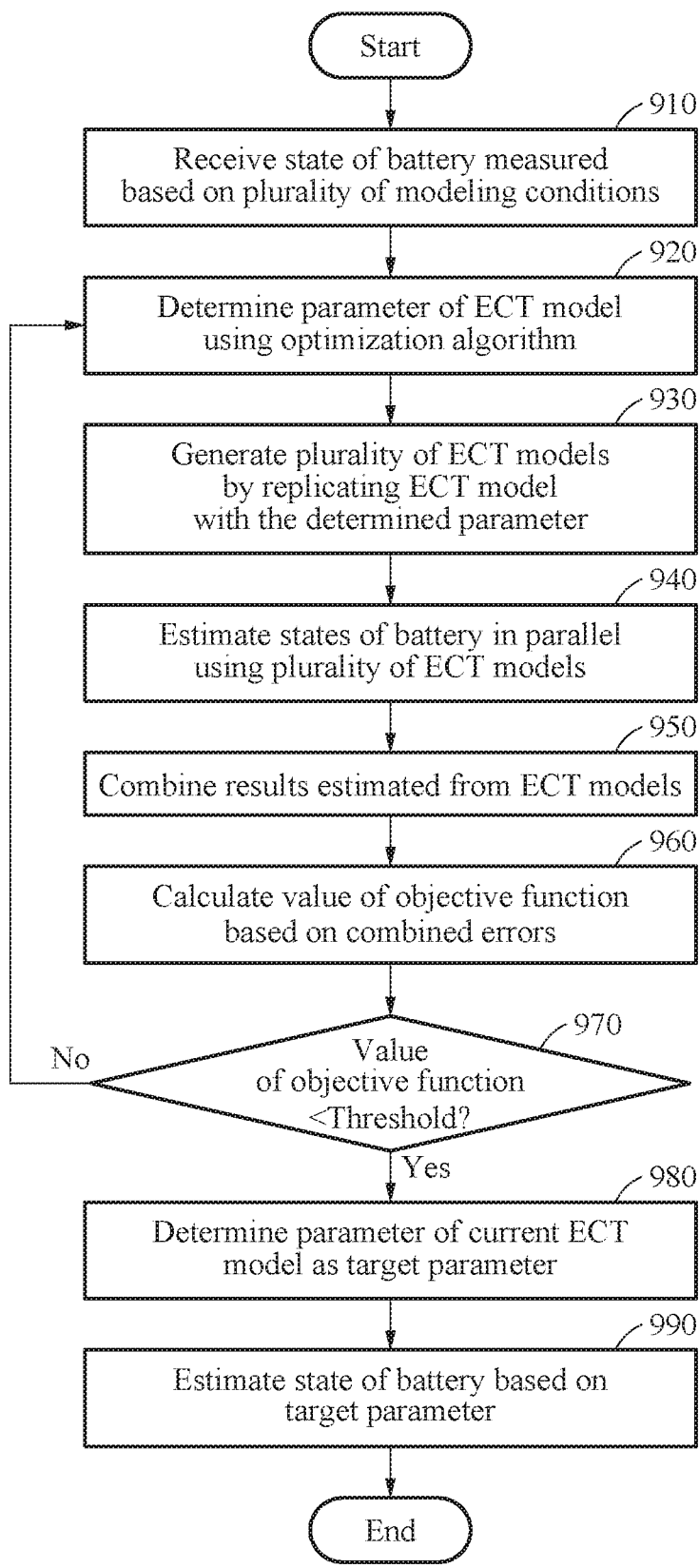
FIG. 9 is a flowchart illustrating an example of an operation of the battery state estimation apparatus of FIG. 1.

FIG. 9 is a flowchart illustrating an example of an operation of the battery state estimation apparatus 10 of FIG. 1.

Referring to FIG. 9, in operation 910, the processor 100 receives a state of the battery 30 measured based on a plurality of modeling conditions.

In operation 920, the processor 100 determines a parameter of an ECT model using an optimization algorithm. The processor 100 may determine an arbitrary parameter within a parameter range that is determined in advance based on a plurality of modeling conditions. For example, the parameter range may be experimentally determined.

In operation 930, the processor 100 generates a plurality of ECT models by replicating the ECT model with the determined parameter. For example, the plurality of ECT models may be configured with initial values of the same parameters.

In operation 940, the processor 100 estimates states of the battery 30 in parallel using the plurality of ECT models. A process by which the processor 100 estimates the states of the battery 30 in parallel may be the same as those of FIGS. 3 and 4.

In operation 950, the processor 100 combines or merges results estimated from the ECT models. For example, the processor 100 may accumulate errors by accumulating estimation results of states of the battery 30 received from a plurality of cores.

In operation 960, the processor 100 calculates a value of an objective function based on combined or merged errors. As described above, the objective function may include, for example, an RMSE or a MAE.

In operation 970, the processor 100 compares the value of the objective function to a threshold. When the value of the objective function is greater than or equal to the threshold, a process of operations 920 through 960 is repeated.

When the value of the objective function is less than the threshold, the processor 100 determines a parameter of a current ECT model as a target parameter in operation 980. In operation 990, the processor 100 estimates the state of the battery 30 based on the target parameter.

The battery state estimation apparatus 10, the processor 100, the memory 200, the cores 310-1, 310-2, 310-$n$, 410-1, 410-2, 410-$n$, 510-1, 510-2, 510-$n$, the first sub-processor 400, the second sub-processor 500, the BMS 50, the server 70, the processors, the sub-processors, the cores, the memories, and other apparatuses, devices, units, modules, and other components in FIGS. 1 to 9 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-9 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method with battery state estimation, comprising:
generating a plurality of electrochemical-thermal (ECT) models corresponding to modeling conditions based on an arbitrary parameter of an ECT model configured to perform modeling of a battery;
determining a target parameter of the ECT model based on an error between an actual state of the battery and a model-derived state of the battery obtained by a parallel operation of the plurality of ECT models; and
estimating a state of the battery based on the target parameter.

2. The method of claim 1, wherein the modeling conditions comprise a profile of a current input to the battery and an initial state of the battery.

3. The method of claim 1, further comprising:
determining the arbitrary parameter within a parameter range that is determined in advance based on the modeling conditions.

4. The method of claim 1, further comprising:
receiving the actual state of the battery, wherein the actual state of the battery is measured based on the modeling conditions.

5. The method of claim 1, wherein the generating of the plurality of ECT models comprises generating the plurality of ECT models by replicating the ECT model with the arbitrary parameter.

6. The method of claim 1, wherein the determining of the target parameter comprises:
assigning a first modeling condition included in the modeling conditions to a first ECT mode included in the plurality of ECT models;
assigning a second modeling condition included in the modeling conditions to a second ECT model included in the plurality of ECT models;
estimating the state of the battery based on the first ECT model;
estimating the state of the battery based on the second ECT model; and
determining the target parameter based on a first error between the actual state of the battery and the state of the battery as estimated based on the first ECT model, and a second error between the actual state of the battery and the state of the battery as estimated based on the second ECT model, and
wherein the estimating of the state of the battery based on the first ECT model and the estimating of the state of the battery based on the second ECT model are performed in parallel.

7. The method of claim 6, wherein the determining of the target parameter based on the first error and the second error comprises:
merging the first error and the second error;
calculating a value of an objective function based on the merged first and second errors; and
determining, as the target parameter, a parameter that minimizes the value of the objective function.

8. The method of claim 1, wherein the determining of the target parameter comprises:
generating a first candidate parameter based on the plurality of ECT models;
generating a second candidate parameter based on the plurality of ECT models; and
determining the target parameter based on the first candidate parameter and the second candidate parameter.

9. The method of claim 8, wherein the first candidate parameter and the second candidate parameter are generated in parallel.

10. The method of claim 8, wherein the generating of the first candidate parameter comprises:
estimating first states of the battery in parallel based on the plurality of ECT models; and
determining, as the first candidate parameter, a parameter that minimizes an objective function that is based on errors between the actual state of the battery and the estimated first states of the battery, and
wherein the generating of the second candidate parameter comprises:
estimating second states of the battery in parallel based on the plurality of ECT models; and
determining, as the second candidate parameter, a parameter that minimizes an objective function based on errors between the actual state of the battery and the estimated second states of the battery.

11. A non-transitory computer-readable storage medium storing instructions that, when executed by a processor, cause the processor to perform the method of claim 1.

12. An apparatus with battery state estimation, comprising:
a processor configured to:
generate a plurality of electrochemical-thermal (ECT) models corresponding to modeling conditions based on an arbitrary parameter of an ECT model configured to perform modeling of a battery;
determine a target parameter of the ECT model based on an error between an actual state of the battery and a model-generated state of the battery obtained by a parallel operation of the plurality of ECT models; and
estimate a state of the battery based on the target parameter; and a memory configured to store an instruction executed by the processor to generate the plurality of ECT models, determine the target parameter of the ECT model, and estimate the state of the battery.

13. The apparatus of claim 12, wherein the modeling conditions comprise a profile of a current input to the battery and an initial state of the battery.

14. The battery state estimation apparatus of claim 12, wherein the processor is further configured to determine the arbitrary parameter within a parameter range that is determined in advance based on the modeling conditions.

15. The apparatus of claim 12, wherein the processor is further configured to receive the actual state of the battery, the actual state of the battery being measured based on the modeling conditions.

16. The apparatus of claim 12, wherein the processor is further configured to generate the plurality of ECT models by replicating the ECT model with the arbitrary parameter.

17. The apparatus of claim 12, wherein the processor comprises:
    a first core corresponding to a first ECT model included in the plurality of ECT models; and
    a second core corresponding to a second ECT model included in the plurality of ECT models,
    wherein the first core is configured to assign a first modeling condition included in the modeling conditions to the first ECT model and to estimate the state of the battery based on the first ECT model,
    wherein the second core is configured to assign a second modeling condition included in the modeling conditions to the second ECT model and to estimate the state of the battery based on the second ECT model,
    wherein the processor is further configured to determine the target parameter based on a first error between the actual state of the battery and the state of the battery as estimated by the first core, and a second error between the actual state of the battery and the state of the battery as estimated by the second core, and
    wherein the first core and the second core estimate the state of the battery in parallel.

18. The apparatus of claim 17, wherein the processor is further configured to:
    merge the first error and the second error;
    calculate a value of an objective function based on the merged first and second errors; and
    determine, as the target parameter, a parameter that minimizes the value of the objective function.

19. The apparatus of claim 12, wherein the processor comprises:
    a first sub-processor configured to generate a first candidate parameter based on the plurality of ECT models; and
    a second sub-processor configured to generate a second candidate parameter based on the plurality of ECT models, and
    wherein the processor is further configured to determine the target parameter based on the first candidate parameter and the second candidate parameter.

20. The apparatus of claim 19, wherein the first candidate parameter and the second candidate parameter are generated in parallel.

21. The apparatus of claim 19, wherein
    the first sub-processor is further configured to:
        estimate, using a first plurality of cores, first states of the battery in parallel based on the plurality of ECT models; and
        determine, as the first candidate parameter, a parameter that minimizes an objective function that is based on errors between the actual state of the battery and the estimated first states of the battery, and
    wherein the second sub-processor is configured to:
        estimate, using a second plurality of cores, second states of the battery in parallel based on the plurality of ECT models; and
        determine, as the second candidate parameter, a parameter that minimizes an objective function based on errors between the actual state of the battery and the estimated second states of the battery.

\* \* \* \* \*